(12) United States Patent
Sunaga et al.

(10) Patent No.: US 7,474,557 B2
(45) Date of Patent: Jan. 6, 2009

(54) MRAM ARRAY AND ACCESS METHOD THEREOF

(75) Inventors: Toshio Sunaga, Ohtsu (JP); Hisatada Miyatake, Ohtsu (JP); Koji Kitamura, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 1186 days.

(21) Appl. No.: 10/134,143

(22) Filed: Apr. 26, 2002

(65) Prior Publication Data

US 2002/0159288 A1   Oct. 31, 2002

(30) Foreign Application Priority Data

Jun. 29, 2001   (JP)   ............................... 2001-199593

(51) Int. Cl.
*G11C 11/14*   (2006.01)
(52) U.S. Cl. ....................................... 365/171; 365/173
(58) Field of Classification Search ................. 365/171, 365/173, 158, 189.04, 230.06
See application file for complete search history.

(56) References Cited

U.S. PATENT DOCUMENTS 5,793,697 A * 8/1998 Scheuerlein ........... 365/230.07
6,529,404 B2 * 3/2003 Hidaka ....................... 365/171
6,754,097 B2 * 6/2004 Sharma et al. .............. 365/158

FOREIGN PATENT DOCUMENTS

| JP | 62150800 | 9/1987 |
| JP | 1151095  | 6/1989 |
| JP | 2218096  | 8/1990 |
| JP | 3016091  | 1/1991 |
| JP | 4089694  | 3/1992 |
| JP | 5109265  | 4/1993 |

OTHER PUBLICATIONS

"Technology Status And Potential For High Speed Nonvolatile Magnetoresistive RAM,"Tehrani, et al., Motorola Labs, Physical Sciences Research Laboratories, pp. 19-24.

* cited by examiner

*Primary Examiner*—Anh Phung
(74) *Attorney, Agent, or Firm*—Lisa U. Jaklitsch

(57) ABSTRACT

A magnetic random access memory (MRAM) array is disclosed herein in which a plurality of wordlines and a plurality of bitlines are provided in matrix form, the wordlines including read wordlines and write wordlines, and memory elements are provided at the intersections of the wordlines and the bitlines, memory elements, respectively, including at least a ferromagnetic layer having a magnetization direction determined by the orientation of a magnetic field generated by an electric current passing through the bitline, and a read wordline driver connected to the memory array adapted to provide a first read signal to a first read wordline of a plurality of read wordlines, wherein a second read signal is provided to activate a second read wordline while the first read wordline remains activated.

7 Claims, 3 Drawing Sheets

MRAM ARRAY AND ACCESS METHOD THEREOF

FIELD OF THE INVENTION

The present invention relates to a memory circuit block that enables a fast data read and a method for accessing the memory circuit block.

BACKGROUND OF THE INVENTION

Conventionally, a row access in DRAM (dynamic random access memory) turns on the transistors of all the memory cells that belong to a selected row address. In a DRAM, data stored in a memory cell as an electric charge. When the transistor of a particular memory cell is turned on, the electric charge in the memory cell and the electric charge on the bitline attached thereto will be shared. This charge sharing corrupts the data stored as the electric charge in the memory cell. At completion of the row access in DRAMs, the DRAM must activate a sense amplifier on each pair of bitlines to restore the data stored in memory cells belonging to the accessed row address. Therefore, in conventional DRAMs, a sense amplifier is needed for each pair of bitlines, and every sense amplifier must be activated on every row access.

In page mode, which is one of the DRAM access methods, data held in activated sense amplifiers are accessed, thereby enabling a very fast access. A burst mode, which is a more advanced fast access mode used in SDRAM (synchronous DRAM) and some Rambus architectures, also relies on the same page mode. It realizes a faster cycle time in column access by generating column addresses internally within a memory chip. However, fast access mode such as the page mode is limited to a method that accesses different column addresses on a selected wordline.

Certain features of DRAMs will now be described as background to the invention, but are not admitted to be prior art. FIG. 3A shows a basic operation of DRAM. When the row address is changed, the DRAM must perform a sequence of operations: (i) restore all data on the wordline that has been selected, (ii) precharge bitlines, (iii) activate a new wordline, (iv) wait until a read signal is provided onto a bitline pair, and (v) start the operation of a sense amplifier, thus resulting in a very long access time and cycle time.

As shown in FIG. 3B, access mode of typical SDRAM DDR (synchronous DRAM Double Data Rate) enables (a) a fast column access in burst mode. However, (b) cycle time between row addresses (Row-to-Row Cycle time) is long because the Array Time Constant, which is the time interval from when the wordline is activated to completing the precharge of a bitline, is large. Its burst data rate is high, but its net data rate averaged over a number of random row accesses is very low. The net data rate is only $4/12=33\%$ of the peak data rate because data bursts are performed at 4 clock edges out of 12 clock edges. To improve this random row access, DRAM has a plurality of banks.

For practical design reasons, the number of banks is typically limited to only two to four per memory chip and the use of fast random row accesses is also considerably limited. Thus, in typical DRAM, column accesses (horizontal accesses) are fast, but row accesses (vertical accesses) are very slow.

In a conventional memory such as SRAM (Static RAM) and DRAM, which stores data as an electric charge, every memory array consists of a matrix of a plurality of wordlines and bitlines. A new access cannot be performed as long as one of the wordlines or bitlines is active. Theoretically, memory cycle time is therefore defined by an array time constant, which is a time interval from the activation of the wordline to the completion of precharge of the bitline, as shown in FIG. 3A.

A read operation and a write operation in typical SRAM and DRAM are both performed by activating the same node (through a selected wordline and a selected bitline). Because data is stored as an electric charge, a read operation can accidentally write data or corrupt the stored data if there is overlap of timing signals. For example, if a new wordline starts activating before the previous wordline has been turned off, all data coupled to the two wordlines collide with each other through a common bitline pair. Bit switch overlap can also cause the corruption of data stored with an electric charge shared between memory cells coupled to two bitlines through a data line. In order to provide sufficient design margin, the array time constant must be increased to allow enough time for satisfying the timing constraints. Consequently, cycle time becomes much longer than a theoretical array time constant, thus resulting in a low memory operation speed.

It is an object of the present invention to provide a memory circuit block and a method for accessing the memory circuit block that allow fast operation.

SUMMARY OF THE INVENTION

An MRAM array access method is provided in a memory array in which a plurality of wordlines and a plurality of bitlines are provided in matrix form, the wordlines including read wordlines and write wordlines, and memory elements are provided at the intersections of the wordlines and the bitlines, memory elements respectively including at least a ferromagnetic layer having a magnetization direction determined by the orientation of a magnetic field generated by an electric current passing through respective bitline; a read wordline driver for providing a read signal onto the read wordline; and a read circuit for providing a bitline read signal to the bitline, the method including: providing a first read signal onto a first read wordline to activate the first read wordline; providing a bitline read signal to a first bitline; and providing a second read signal onto a second read wordline while the first read wordline remains activated, preferably when the first read signal is falling.

A magnetic random access memory (MRAM) array is disclosed herein in which a plurality of wordlines and a plurality of bitlines are provided in matrix form, the wordlines including read wordlines and write wordlines, and memory elements are provided at the intersections of the wordlines and the bitlines, memory elements, respectively, including at least a ferromagnetic layer having a magnetization direction determined by the orientation of a magnetic field generated by an electric current passing through the bitline, and a read wordline driver connected to the memory array adapted to provide a first read signal to a first read wordline of a plurality of read wordlines, wherein a second read signal is provided to activate a second read wordline while the first read wordline remains activated.

Among advantages achieved by the present invention, sequential row accesses can be performed at faster speed due to the nondestructive way in which magnetic storage elements of the memory array are read.

DETAILED DESCRIPTION OF A PREFERRED EMBODIMENT

An embodiment of a memory circuit block and access method of the present invention will be described with respect to the accompanying drawings.

Figure 1:
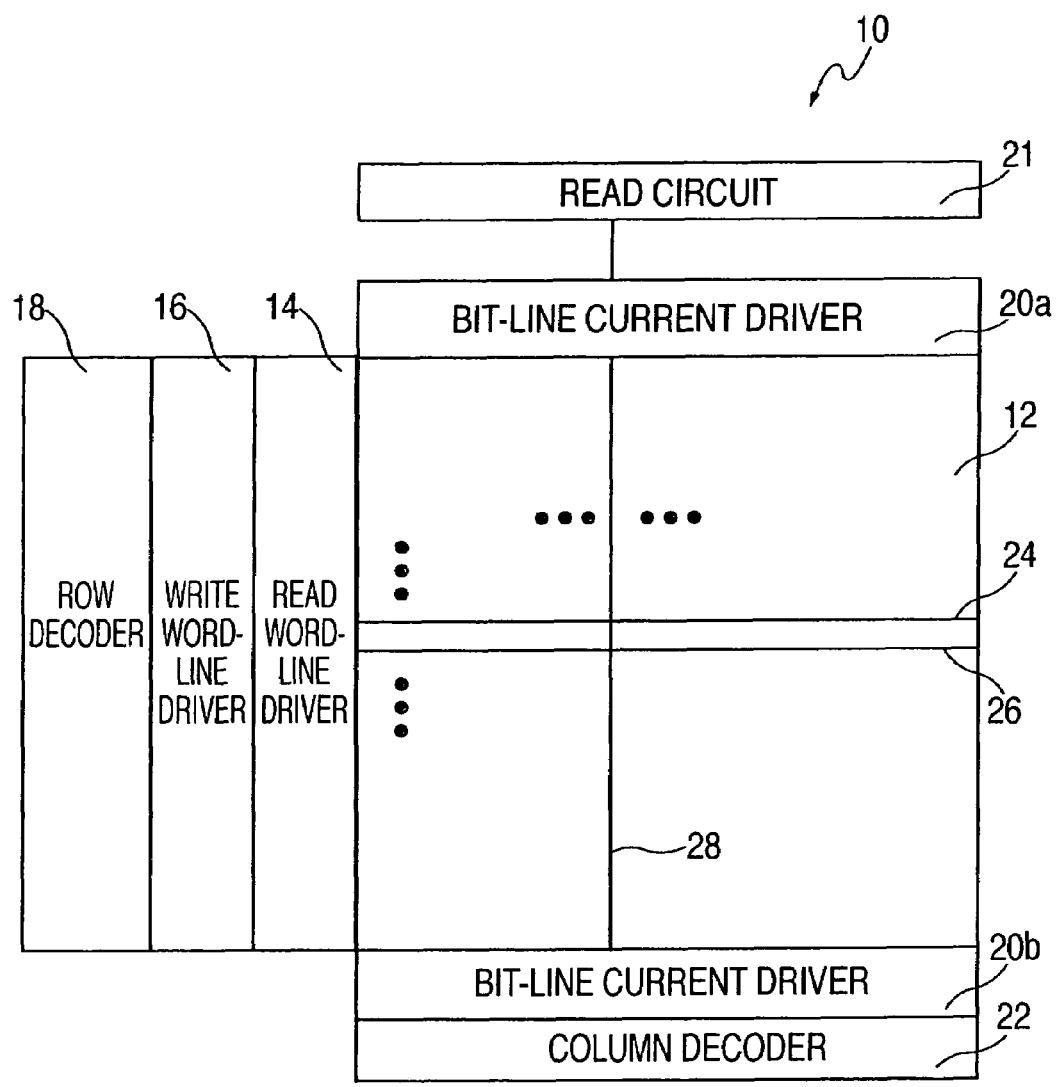
FIG. 1 shows a configuration of a memory circuit block according to the present invention.

A memory circuit block 10 shown in FIG. 1 comprises a memory array 12 including a memory element for storing data, wordlines (read wordlines 24 and write wordlines 26), and bitline pairs 28, a read wordline driver 14 for providing a read signal to a read wordline 24, and a read circuit 21 for providing a bitline read signal to a bitline pair 28. The memory circuit block 10 is used for a memory chip of memory such as MRAM (Magnetic Random Access Memory).

The read wordline driver 14 comprises means of providing a read signal to a first read wordline 24 and means of providing a read signal to a second read wordline 24 while the first read wordline 24 is falling after the first read wordline 24 becomes active.

In the memory array 12 for storing data, a matrix of a plurality of wordlines (read wordlines 24 and write wordlines 26) and a plurality of bitline pairs 28 is provided and a non-volatile memory element is provided at each intersection. The wordline is identified by a row address and the bitline pair 28 is identified by a column address. The memory element is identified as a memory element positioned at the intersection of the wordline at the identified row address and the bitline pair 28 at the identified column address by identifying the row address and column address. The memory element is a MTJ (Magnetic Tunnel Junction) element. The MTJ element comprises a fixed layer, which is a ferromagnetic layer of which at least the direction of magnetization is fixed, a tunnel barrier, which is an insulator conducting a tunnel current, and a free layer, which is a ferromagnetic layer of which magnetization direction changes depending on the magnetic field direction. The memory element may be a GMR (Giant Magnetoresistive) element.

The memory circuit block 10 comprises a read wordline driver 14 for activating a read wordline 24, a write wordline driver 16 for providing a write current onto a write wordline 26 and a row decoder 18 for operating the read wordline driver 14 and the write wordline driver 16. In addition, bitline current drivers 20a and 20b for selecting a bitline pair 28 and feeding a write current through the pair 28 are provided at both ends of the bitline pair 28, and a column decoder 22 for operating the bitline current drivers 20a, 20b are included. Each driver generates a pulse signal as a read signal or write signal and provides the pulse signal to each line to activate the line.

Also provided is a read circuit 21, such as a sense amplifier, for providing a read signal to a bitline pair 28 and reading data from the memory element. A bit switch (not shown) is used to select the bitline current drivers 20a, 20b or the read circuit 21 for the connection of the bitline pair 28. The read circuit 21 includes means of continuously providing a bitline read signal to a predetermined bitline pair 28 while a read signal is provided sequentially to a number of read wordlines 24. Thus, data is read from different memory elements accessed by the same bitline pair by changing the read wordlines 24 one after another while the bitline pair 28 is active. In other words, the memory circuit block 10 of the present invention is capable of reading data by changing row addresses one after another with a column address being fixed.

The memory circuit block 10 has a two-cell structure called "twin cell" consisting of T/C (True/Complement) and bitlines are paired (bitline pairs 28). Therefore, data "0" or "1" can be determined by detecting which bitline is at a higher or lower potential. If the memory circuit block 10 did not have a twin cell structure, a reference bitline potential would still be required for determining whether data is "0" or "1" and therefore a bitline selected for reading the data would be paired with a reference bitline.

The memory circuit block 10 has different wordlines: the read wordlines 24 and the write wordlines 26. To read data, the read wordlines 24 are used. To write data, the write wordlines 26 are used. Because there are the two wordlines, a data read operation cannot accidentally write data.

Data is stored as the magnetization direction of a MTJ element, rather than an electric charge. Even if timing signals overlap one another as in SRAM and DRAM, data corruption does not occur, because data stored in a MTJ element remains stored after a read access, therefore eliminating the need for a restore operation after a read access. For example, if the falling edge of a read signal for the first read wordline 24 accessed first overlaps the rising edge of a read signal for the second read wordline 24 accessed next during a data read, stored data does not corrupt because the MTJ element stores data as the magnetization direction, not as electrical charge. That is, the second read signal can be provided onto the second read wordline 24 while the first read signal provided onto the fist read wordline 24 is falling.

In addition, data in an memory element at the intersection of a first read wordline 24 and a first bitline pair 28 can be read by providing a read signal to the first bitline pair 28 while the first read wordline 24 is active. When the first read signal provided to the first read wordline 24 falls, a bitline read signal can be provided at the same time to a second bitline pair 28 to read data from a memory element at the intersection of the second read wordline 24 and the second bitline pair 28.

Thus, the timing constraints placed on circuit design in operating all the read wordlines 24 and other lines in the memory circuit block 10 can be relieved and therefore higher speeds can be achieved quite easily.

Figure 3A:
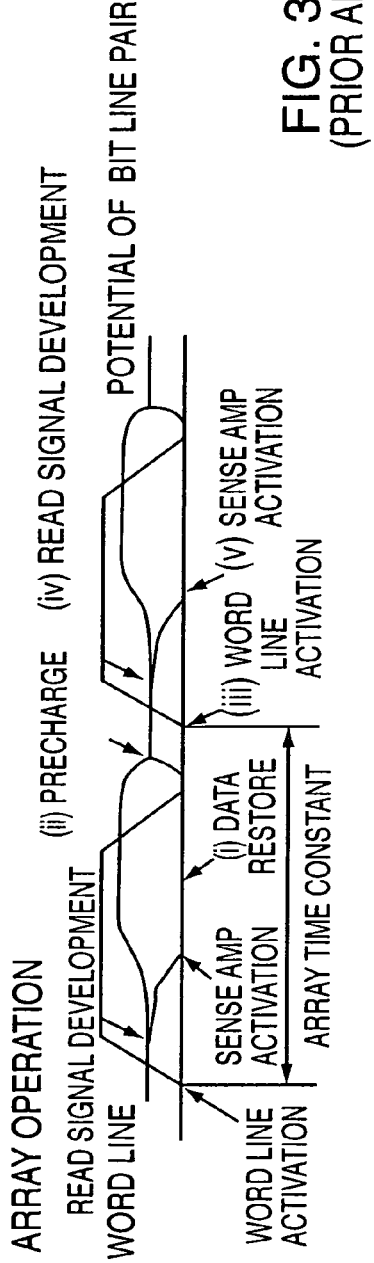
FIG. 3 shows a row-row access method in a memory circuit block according to a prior art, in which part A shows a memory array operation state and part B shows row access mode.
Figure 3B:
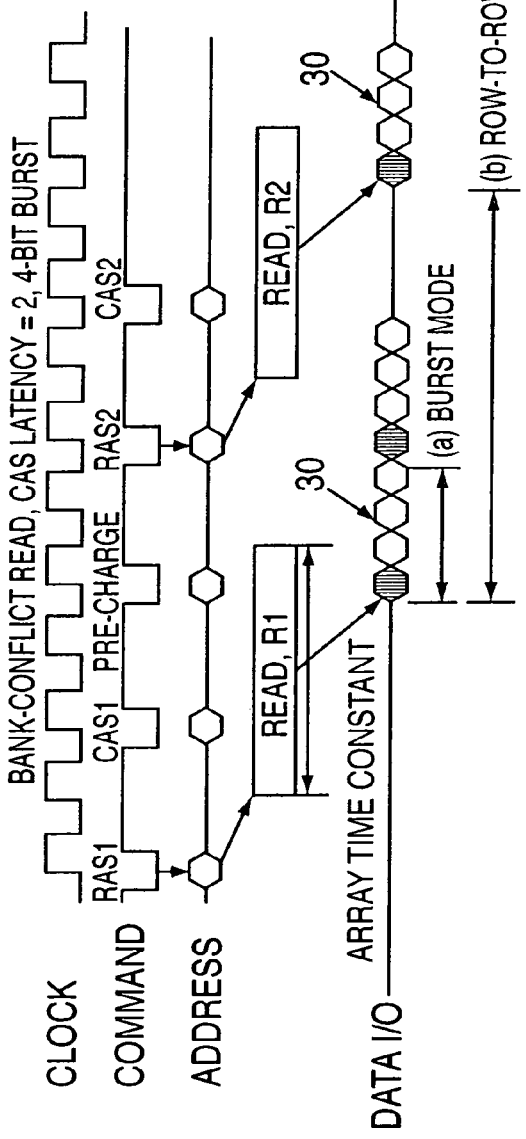

The memory circuit block 10 has several advantages during a read operation compared with SRAM and DRAM. Because reading the data from the memory circuit block 10 is nondestructive, (i) the data restore operation shown in FIG. 3A is not required. In addition, because a direct current is fed to the MTJ element to read data, (ii) the bitline precharge operation shown in FIG. 3A is not required. Because these two time-consuming sequential operations are not required, the array time constant is significantly reduced.

During read operation of the memory circuit block 10, the read wordline 24 is activated to supply a DC current to a bitline pair 28 and the MTJ element. A voltage which can be determined from the resistance of the MTJ element is sensed and amplified by the read circuit (sense amplifier) 21.

The sum of the RC time constants (or time constant) of a sensing line, which is determined by the resistance (2-3 kW) of the MTJ element, the resistance (1-2 kW) between the drain and source of a memory cell transistor (MOSFET) in the on state, and the capacitance (0.3-0.4 pF) of the bitline is very small, for example, 3 nsec or less. The small RC time constant translates into a fast read in a row access because a read signal is generated fast when an access is changed to a location having different row and column addresses.

In a read operation in the memory circuit block 10, read timing signals may be overlap each other and two operations, data restoring and precharging, which take a long time in conventional memory arrays, are not required. In addition, read signal generating time and sensing time can be reduced to the RC time constant of the sensing line.

Figure 2A:
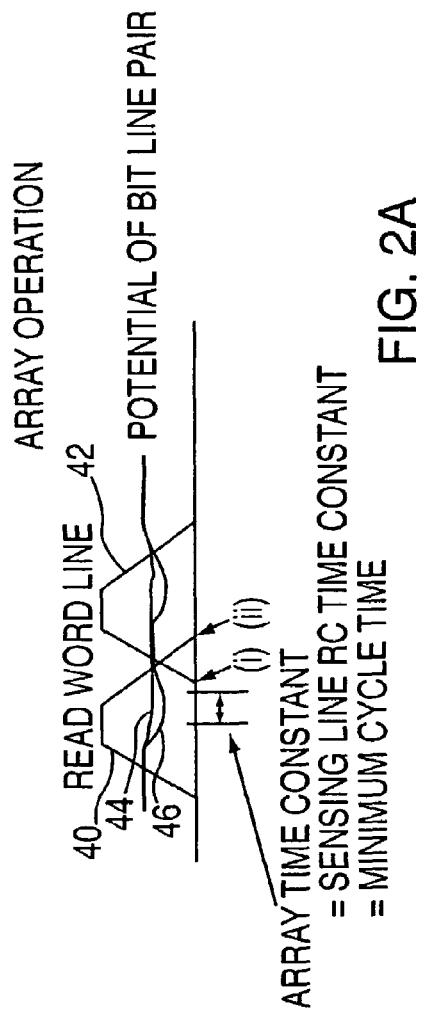
FIG. 2 shows a method for accessing the memory circuit block according to the present invention, in which part A shows a memory array operation state and part B shows row access mode.

Thus, the array time constant during the read operation of the memory circuit block 10 can be reduced to the value equal to the RC time constant of the sensing line as shown in FIG. 2A. The access method of the present invention is based on the fact described above and row addresses are sequentially accessed (vertical accessing) in a similar way as in DRAM page mode in which column addresses are accessed (horizontal accessing), hence called "vertical page mode". The vertical page mode, which is the access method of the present invention, will be described below.

In vertical page mode, row addresses are sequentially accessed with a column address being fixed. Data stored in memory elements at the intersections of a bitline pair at a fixed column address and wordlines at sequential row addresses are sequentially read. FIG. 2A illustrates two read operations, the first read access and the subsequent, second read access. Solid lines in FIG. 2A represent changes with time in a first read signal 40 provided onto a first read wordline 24 accessed during the first read access and in a second read signal 42 provided to a second read wordline 24 during the second read access. Dotted lines 44, 46 represent voltage changes with time on a bitline pair 28 of a fixed column address during a read. In FIG. 2A, the upper voltage 44 indicates a true bitline voltage and the lower voltage 46 indicates a complement bitline voltage. During the first read access, the next read signal 42 is generated immediately because the RC constant of a sensing line is small as described above. At some midpoint ((i) in FIG. 2), while the first read signal 40 provided onto the first read wordline 24 is still falling, the second read signal 42 is provided onto the second read wordline 24 and rises. Although the read signals 40, 42 on the two read wordlines 24 collide with each other in the period from (i) to (ii) during which an overlap occurs, stored data is not corrupted because of the nondestructive way in which MTJ elements of the memory array are read.

At the same time when the first read signal 40 on the first read wordline 24 falls, the next bitline read signal is provided to the bitline pair 28 by using the short RC time constant of the sensing line without precharging the bitline pair 28.

In this method, an error-free fast read access can be made even if the read signals overlap each other on the read wordlines 24. The array time constant in this method is equal to the RC time constant of the sensing line and also equal to cycle time in vertical page mode. Because of the short RC time constant, a high row access read speed can be achieved.

Figure 2B:
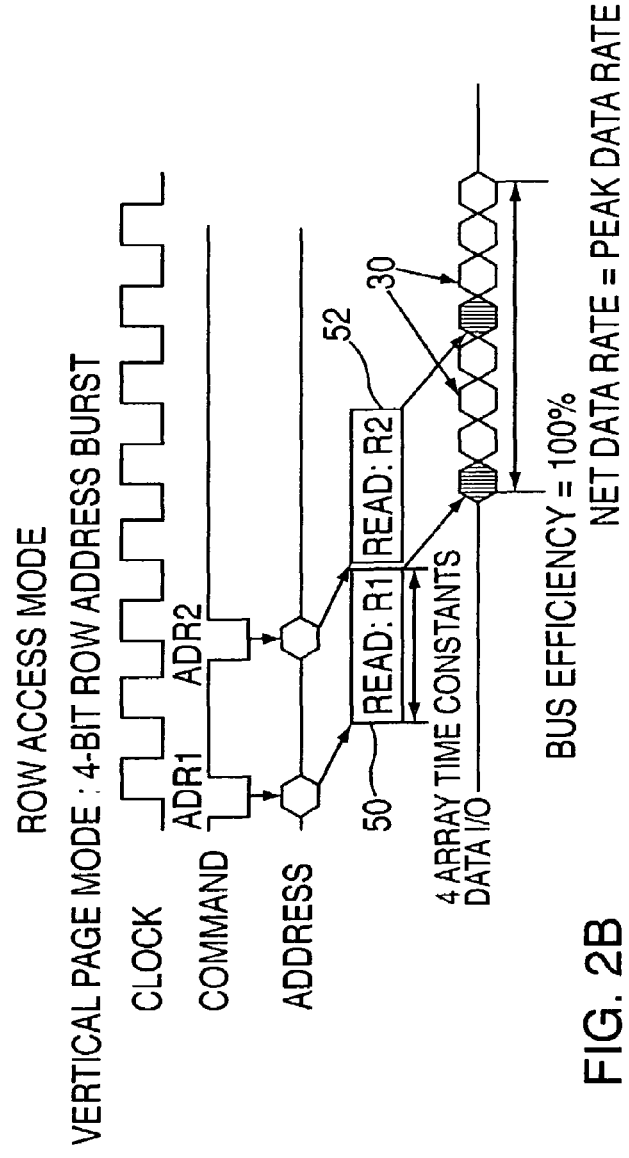

A row address amplifier circuit is provided on the chip of the memory circuit block 10 of the present invention, as in burst mode of SDRAM. During a row access, a first row address is provided from a memory controller and latched by the memory chip. As shown in FIG. 2B, the subsequent three row addresses are generated internally by the address amplifier circuit to provide 4-bit burst read mode.

The time period of "Read R1" 50 or "Read R2" 52 in FIG. 2B is four times longer than the array time constant shown in FIG. 2A. In the burst of data 30 on a data I/O line, the data 30 is continuous as shown in FIG. 2 and, therefore, the data transfer rate equal to the maximum row access speed can always be achieved. Because the RC time constant of the sensing line is very short, read data becomes effective immediately when the wordline is changed while the same column address is retained. That is, conventional page mode is provided along the columns. This access method of the memory circuit block 10 provides the same fast read mode at any column and row addresses.

The present invention offers several options. While the read operation of the memory circuit block 10 of the present invention is similar to that of SDRAM in burst mode, row addresses are sequentially counted up in units of 4 bits within the memory chip, unlike the conventional SDRAM. However, it is not necessarily required that the row addresses are counted up with a column address being fixed. Both row and column accesses can be changed in each array time constant. Random row accessing is thus provided in each array time constant.

Another option is a mode in which a conventional multi-bit burst in units of two, four, or more bits along columns is used as a basic operation and the basic operation is repeated for a plurality of different row addresses. In this mode, one array time constant is included in each row access in FIG. 2B. This mode is available if cycle time is shorter than the RC time constant because of a fast clock.

While the memory circuit block and access method according to the present invention have been described, the present invention is not limited to the above-described embodiments. The present invention can be implemented in other forms to which various improvements, modification, variations are applied by those skilled in the art based on their knowledge without departing from the spirit of the present invention.

LIST OF SYMBOLS USED

| | List of Symbols Used |
|---|---|
| 10 | Memory circuit block |
| 12 | Memory cell |
| 14 | Read wordline driver |
| 16 | Write wordline driver |
| 18 | Row decoder |
| 20a, 20b | Bitline current driver |
| 21 | Read circuit |
| 22 | Column decoder |
| 24 | Read wordline |
| 26 | Write wordline |
| 28 | Bitline pair |
| 30 | Data |
| 40 | First read signal |
| 42 | Second read signal |
| 44 | True bitline voltage |
| 46 | Complement bitline voltage |
| 50 | Read R1 |
| 52 | Read R2 |

What is claimed is:

1. An access method for accessing a memory circuit block comprising a memory array in which a plurality of wordlines and a plurality of bitlines are provided in matrix form, said respective wordlines consisting of read wordlines and write wordlines, and memory elements are provided at the intersections of the wordlines and the bitlines, each of said memory element including at least a ferromagnetic layer having a magnetization direction determined by the orientation of a magnetic field generated by an electric current passing through respective bitline; a read wordline driver for providing a read signal to said read wordline; and a read circuit for providing a bitline read signal to said bitline, said access method comprising the steps of:

providing a first read signal onto a first read wordline to activate said first read wordline;

providing said bitline read signal to a first bitline; and thereafter providing a second read signal onto a second read wordline while said first read signal is falling.

2. The memory circuit block access method according to claim 1, further comprising reading data from a first memory element at the intersection of said first read wordline and said first bitline.

3. The memory circuit block access method according to claim 1, further comprising providing a bitline read signal to a second bitline when providing said second read signal to said second read wordline.

4. The memory circuit block access method according to claim 3 further comprising, after providing said bitline read signal to said second bitline, reading data from a second memory element at the intersection of said second read wordline and said second bitline.

5. A magnetic random access memory (MRAM) array circuit block, comprising:

a memory array in which a plurality of wordlines and a plurality of bitlines are provided in matrix form, said respective wordlines comprising read wordlines and write wordlines, respectively, and memory elements provided at intersections of said wordlines and said bitlines, each said memory element including at least a ferromagnetic layer having a magnetization direction determined by the orientation of a magnetic field generated by an electric current passing through a respective bitline coupled to said memory element;

a read wordline driver adapted to provide a read signal onto a first read wordline and adapted to provide a read signal onto a second read wordline while said first read signal is active; and a read circuit for providing a bitline read signal to said bitline.

6. The memory circuit block according to claim 5, wherein said read circuit is adapted to provide said bitline read signal to a predetermined bitline while said read signal is provided sequentially to respective ones of said plurality of read wordlines.

7. The memory circuit block according to claim 6, wherein said memory element comprises an MTJ (Magnetic Tunnel Junction) element or a GMR (giant magnetoresistive) element.

* * * * *